United States Patent [19]
Miyamoto

[11] Patent Number: 5,831,900
[45] Date of Patent: Nov. 3, 1998

[54] NONVOLATILE MULTI-LEVEL SEMICONDUCTOR MEMORY DEVICE WITH REGISTERS

[75] Inventor: Junichi Miyamoto, Kanagawa-ken, Japan

[73] Assignee: Kabushiki Kaisha Toshiba, Kawasaki, Japan

[21] Appl. No.: 713,856

[22] Filed: Sep. 12, 1996

[30] Foreign Application Priority Data

Sep. 13, 1995 [JP] Japan ................................. 7-234846

[51] Int. Cl.$^6$ ................................................. G11C 11/34
[52] U.S. Cl. ........................... 365/185.03; 365/185.23
[58] Field of Search .................. 365/185.23, 185.17, 365/189.09, 230.06, 185.03, 189.12, 185.19

[56] References Cited

U.S. PATENT DOCUMENTS

| | | | |
|---|---|---|---|
| 5,214,605 | 5/1993 | Lim | 365/185.19 |
| 5,278,790 | 1/1994 | Kanabara | 365/230.06 |
| 5,371,705 | 12/1994 | Nakayama | 365/185.23 |
| 5,388,084 | 2/1995 | Itoh | 365/185.23 |
| 5,428,568 | 6/1995 | Kobayashi | 365/185.23 |

*Primary Examiner*—A. Zarabian
*Attorney, Agent, or Firm*—Ranner & Witcoff, Ltd.

[57] ABSTRACT

A nonvolatile semiconductor memory device includes nonvolatile memory cells (C), constant voltage circuits for applying one of different verify voltages to control gates of the nonvolatile memory cells C in response to control data introduced into the memory device from the exterior, and writing and sensing circuit circuits for applying a potential to drains of the nonvolatile memory cells C in response to write data introduced into the memory device and for detecting and amplifying currents between drains and sources of the nonvolatile memory cells By dividing the memory cell array 501 and a serial register 502 into some parts and by connecting an external SRAM 503 so as to progress the transfer of data from the memory cell array 501 to the serial register 502 and the transfer of data from the serial register 502 to the external SRAM 503 in parallel, the read speed is increased.

8 Claims, 15 Drawing Sheets

| | READING | WRITING | ERASING |
|---|---|---|---|
| SIGNAL A | Vcc | Vcc | GND |
| SIGNAL B | GND | GND | Vcc |
| SIGNAL C | GND | GND | Vpp |
| SIGNAL D | Vcc | GND | GND |
| SIGNAL E | GND | Vcc | GND |
| POWER SOURCE VA | Vcc | Vpp | Vpp |
| POWER SOURCE VB | Vcc | Vm | Vcc |
| POWER SOURCE VC | Vcc | Vcc | Vpp |

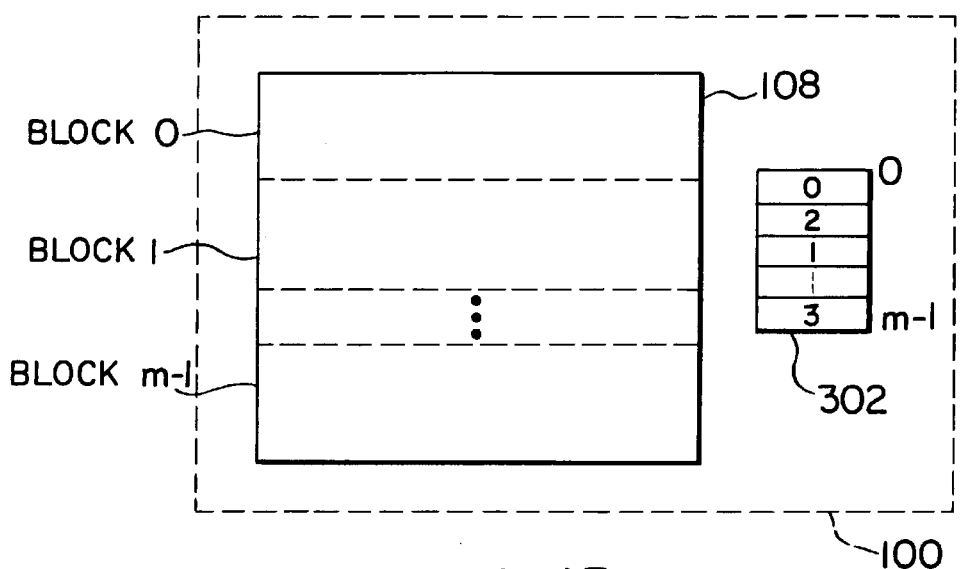
F I G. 15
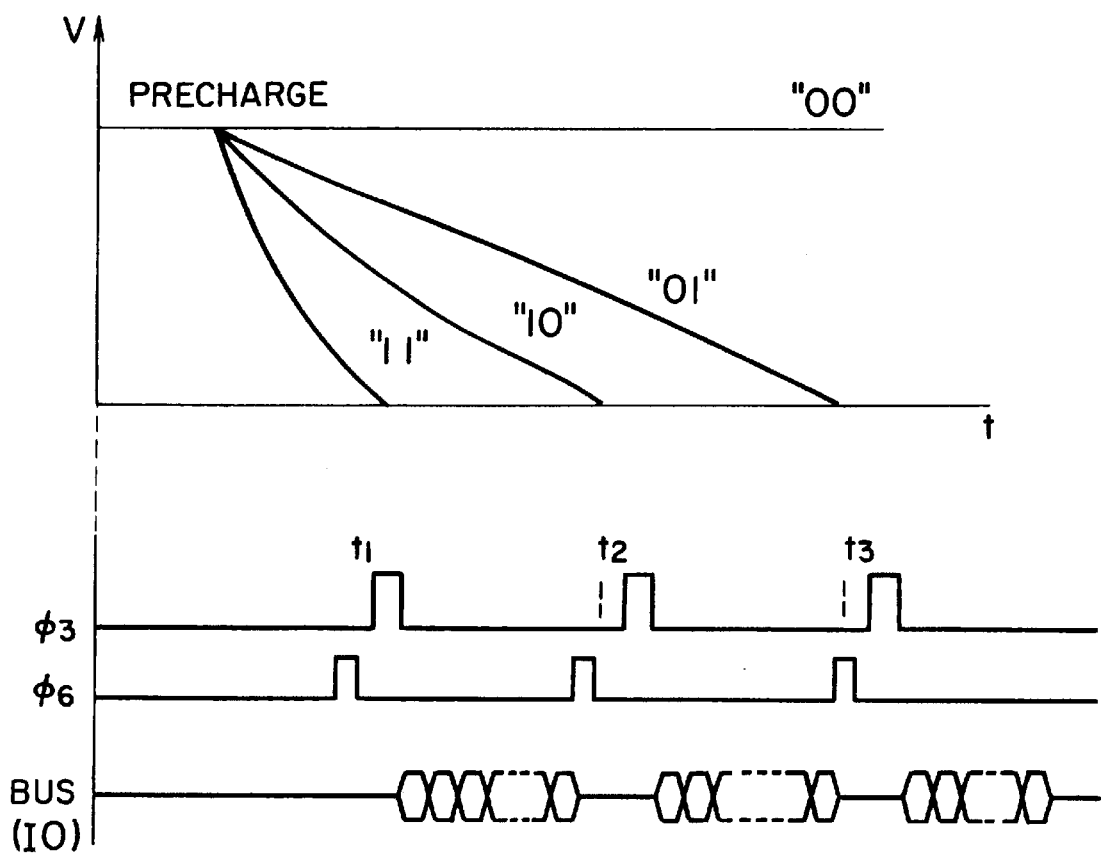
F I G. 16

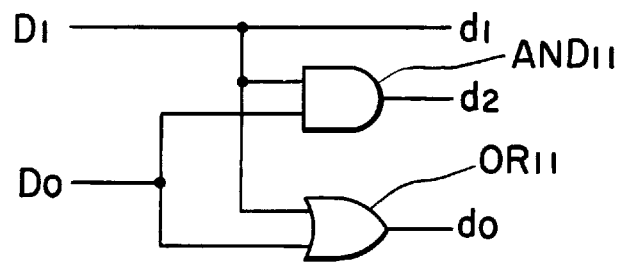
F I G. 20A
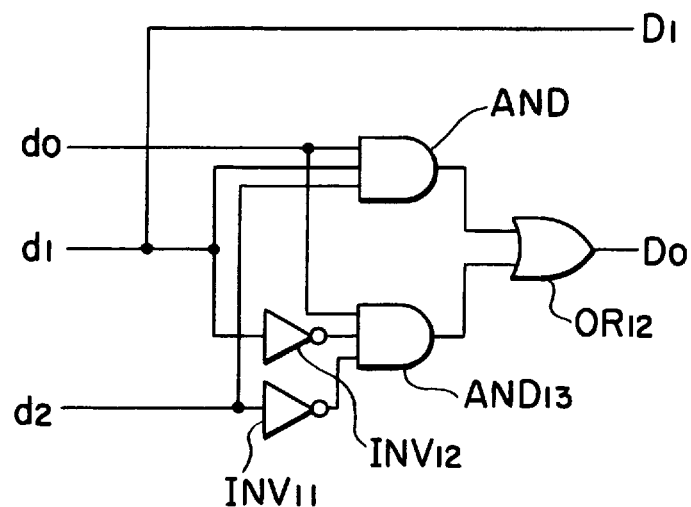
F I G. 20B

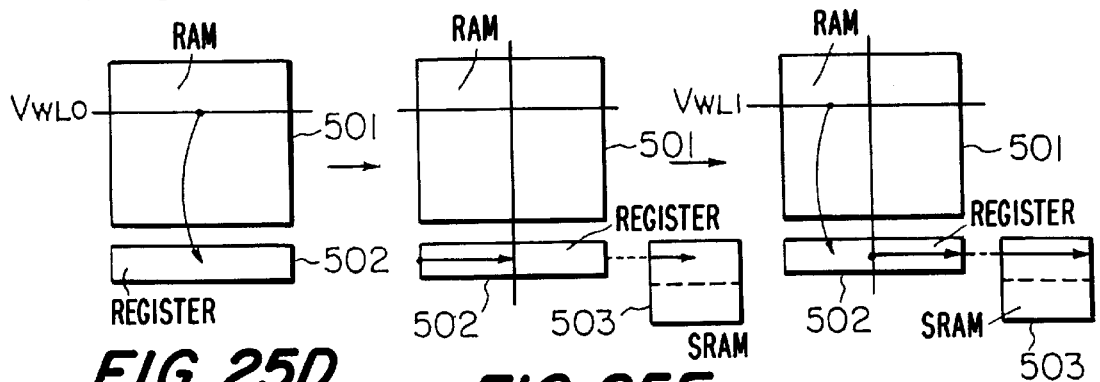
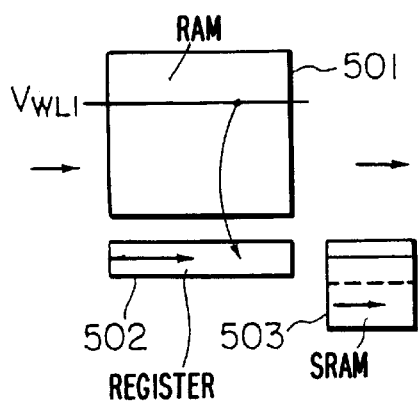
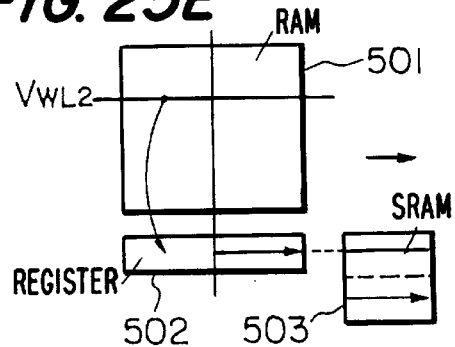
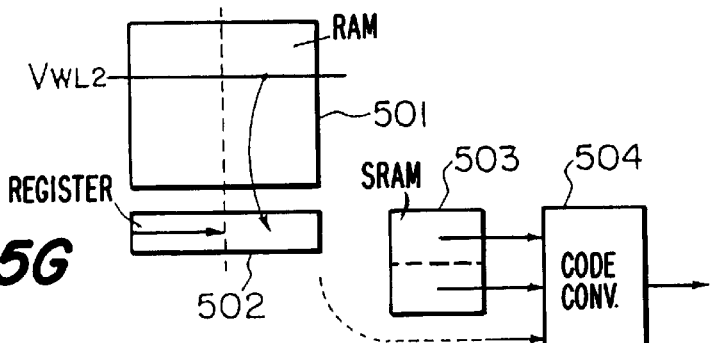
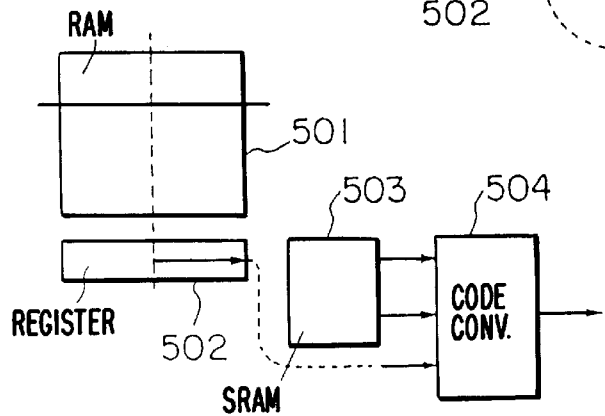

NONVOLATILE MULTI-LEVEL SEMICONDUCTOR MEMORY DEVICE WITH REGISTERS

BACKGROUND OF THE INVENTION

This invention relates to a nonvolatile semiconductor storage device and a method for using it, and more particularly to a multi-level memory, and its usage, which can store multi-level (multi-value) data in memory cells made of stacked MOS transistors.

A flash memory for storing multi-level data is disclosed in detail in ISSCC '95 Digest of Technical Papers, p. 133, for example. The memory has an architecture using flash cells as its reference cells to control the current flow into the reference cells and to cope with the read-out potential in accordance with the distribution of threshold values of the cells.

A process for reading data from a NAND flash memory includes random access for reading data of one row of memory cell arrays and for storing it in registers, and subsequent reading of the storage of the registers. When a four-value memory is to be read three times, reading and conversion into a two-value data need the time $$3t_R + 3t_S + t_{conv}$$

where $t_R$ is the random access time, $t_S$ is the time for reading registers, and $t_{conv}$ is the time for conversion into a two-value data. In a particular case where the random access time $t_R$ is 10 $\mu S$, the register reading time $t_S$ is 25.6 $\mu S$ for reading 512 bytes in 50 nS, and the time $t_{conv}$ for conversion into a two-value data is 5 $\mu S$, the total time for reading thrice and for conversion into two values amounts in $$10 \times 3 + 25.6 \times 3 + 5 = 111.8 \,\mu S$$

The above multi-level memory involves the following problems.

(1) A $2^n$-value memory needs n sense amplifiers. Specifically, a four-value memory needs two sense amplifiers, and an eight-value memory needs three sense amplifiers. Thus the multi-level memory requires a larger area for sense amplifiers.

(2) The number of reference cells is fixed at the time of its design and cannot be flexibly changed later. In a particular case where the number of reference cells is four, the memory must be a four-value memory even if the cells are uniform enough to realize a more-value memory. In another case where a four-value memory cannot be realized due to varieties in process parameters during fabrication, although it will be used as a two-value memory, all the sense amplifiers and other circuit elements intended for use with the four-value memory become invalid, and result in an substantial increase in cost as compared with an originally two-value memory.

(3) The area occupied by sense amplifiers is too large to exactly cope with the distribution of cells within the chip.

(4) Reading from a NAND flash memory takes time against the demand for high-sped reading.

SUMMARY OF THE INVENTION

It is therefore an object of the invention to provide a nonvolatile semiconductor storage device for multi-level storage, and a method of using it, which is flexibly responsive to the number of multiple levels and enables minimization of the chip size.

A further object of the invention is to provide a nonvolatile semiconductor storage device, and a method for using it, which can be read at a high speed.

According to the first aspect of the present invention, there is provided a nonvolatile semiconductor memory device comprising:

nonvolatile memory cells each including a source and a drain both formed on one surface of a semiconductor substrate, and including a floating gate and a control gate which are stacked on the semiconductor substrate above a portion between the source and the drain via insulation films;

a word line driving circuit for applying one of a plurality of predetermined potentials to said control gates of the nonvolatile memory cells, depending on a control data introduced into said memory device; and writing and sensing circuit for applying a potential to said drains in accordance with write data introduced into said memory device and for detecting and amplifying the current flowing between the drain and the source in each said nonvolatile memory cell.

According to the second aspect of the present invention, there is provided a method for using a nonvolatile semiconductor memory device including nonvolatile memory cells which each have a source and a drain both formed on one surface of a semiconductor substrate, and including a floating gate and a control gate which are stacked on the semiconductor substrate above a portion between the source and the drain via insulation films, comprising:

when a first level of multi-level data including at least a first level and a second level is to be written, repeating a series of behaviors until writing of said first level is completed, said series of behaviors including:

applying a predetermined write voltage between said control gate and said drain to introduce a charge into said floating gate and to change the threshold level of said nonvolatile memory cell; applying a voltage responsive to said first level to said control gate and detecting and amplifying a current flowing between the source and the drain of said nonvolatile memory cell to perform verify reading; and confirming whether the writing of said first level is finished or not;

when a second level of said multi-level data is to be written, repeating a series of behaviors until writing of said second level is completed, said series of behaviors including: applying said write voltage between said control gate and said drain to introduce a charge into said floating gate and to change the threshold level of said nonvolatile memory cell; applying a voltage responsive to said second level to said control gate and detecting and amplifying a current flowing between the source and the drain of said nonvolatile memory cell to perform verify reading; and confirming whether the writing of said first level is finished or not.

According to the third aspect of the present invention, there is provided a method for using a nonvolatile semiconductor memory device including nonvolatile memory cells which each have a source and a drain both formed on one surface of a semiconductor substrate, and including a floating gate and a control gate which are stacked on the semiconductor substrate above a portion between the source and the drain via insulation films, comprising:

when a first level of multi-level data is to be written, repeating a series of behaviors until writing of said first level is completed, said series of behaviors including: applying a predetermined write voltage between said control gate and said drain to introduce a charge into said floating gate and to change the threshold level of said nonvolatile memory cell; applying a voltage responsive to said first level to said control gate and detecting and amplifying a current flowing between the source and the drain of said nonvolatile memory cell to perform verify reading; and confirming whether the writing of said first level is finished or not;

when a second level of said multi-level data is to be written, repeating a series of behaviors including a first step and a second step until writing of said second value is completed, said first step including: applying said write voltage between said control gate and said drain to introduce a charge into said floating gate and to change the threshold value of said nonvolatile memory cell by a large amount than that for writing said first value; applying a voltage responsive to said second value to said control gate and detecting and amplifying a current flowing between the source and the drain of said nonvolatile memory cell to perform verify reading; and confirming whether the writing of said first value is finished or not, and said second step including: applying said write voltage between said control gate and said drain to introduce a charge into said floating gate and to change the threshold value of said nonvolatile memory cell; applying a voltage responsive to said second value to said control gate and detecting and amplifying a current flowing between the source and the drain of said nonvolatile memory cell to perform verify reading; and confirming whether the writing of said first value is finished or not.

According to the fourth aspect of the present invention, there is provided a method for using a nonvolatile semiconductor memory device including nonvolatile memory cells which each have a source and a drain both formed on one surface of a semiconductor substrate, and including a floating gate and a control gate which are stacked on the semiconductor substrate above a portion between the source and the drain via insulation films, comprising:

when a first value of multi-level data is to be written, repeating a series of behaviors until writing of said first value is completed, said series of behaviors including: applying a predetermined write voltage between said control gate and said drain to introduce a charge into said floating gate and to change the threshold value of said nonvolatile memory cell; applying a voltage responsive to said first value to said control gate and detecting and amplifying a current flowing between the source and the drain of said nonvolatile memory cell to perform verify reading; and confirming whether the writing of said first value is finished or not;

when a second value of said multi-level data is to be written, repeating a series of behaviors until writing of said second value is completed, said series of behaviors including: while writing said first value in said nonvolatile memory cell, applying said write voltage between said control gate and said drain to introduce a charge into said floating gate and to change the threshold value of said nonvolatile memory cell; applying a voltage responsive to said second value to said control gate and detecting and amplifying a current flowing between the source and the drain of said nonvolatile memory cell to perform verify reading: and confirming whether the writing of said first value is finished or not.

According to the fifth aspect of the present invention, there is provided a nonvolatile semiconductor memory device, comprising:

a memory cell array including a plurality of nonvolatile memory cells arranged in a matrix in which memory cells in one row are connected by a common word line and memory cells in one column are connected by a common bit line;

a first register for holding a first data introduced into said memory device;

a word line voltage generating circuit for generating a plurality of different voltages in response to contents held in said first register;

a second register for holding a second data introduced into said memory device;

a word line selecting circuit for selecting said word line in response to contents held in said second register;

a word line driving circuit for driving said word line selected by said word line selecting circuit with a voltage generated by said word line voltage generating circuit;

a plurality of sense amplifier circuits for detecting and amplifying the potential of said bit line and for holding data corresponding to the potential of the bit line; and a column selecting circuit for selectively outputting the data held in said sense amplifier circuits in response to a third data introduced into said memory device.

According to the sixth aspect of the present invention, there is provided a nonvolatile semiconductor memory device, comprising:

a memory cell array including a plurality of nonvolatile memory cells arranged in a matrix in which memory cells in one row are connected by a common word line and memory cells in one column are connected by a common bit line;

a first register for holding a first data introduced into said memory device;

a word line voltage generating circuit for generating a plurality of different voltages in response to contents held in said first register;

a second register for holding a second data introduced into said memory device;

a word line selecting circuit for selecting said word line in response to contents held in said second register;

a word line driving circuit for driving said word line selected by said word line selecting circuit with a voltage generated by said word line voltage generating circuit;

a plurality of sense amplifier circuits for detecting and amplifying the potential of said bit line and for holding data corresponding to the potential of the bit line;

a column selecting circuit for selectively outputting the data held in said sense amplifier circuits in response to a third data introduced into said memory device; and a plurality of flag cells each associated with a memory cell group including a plurality of memory cells in said memory cell array to hold the number of data stored in a single memory cell in the associated memory cell group.

According to the seventh aspect of the present invention, there is provided a nonvolatile semiconductor memory comprising:

a memory cell array including a plurality of nonvolatile memory cells arranged in a matrix in which memory cells in one row are connected by a common word line and memory cells in one column are connected by a common bit line;

a plurality of flag cells each associated with a memory cell group including a plurality of memory cells in said memory cell array to hold the number of data stored in a single memory cell in the associated memory cell group;

a word line voltage generating circuit for generating a plurality of different voltages responsive to contents of said flag cells;

a register for holding an address signal introduced into said memory device;

a word line selecting circuit for selecting said word line in response to contents held in said second register;

a word line driving circuit for driving said word line selected by said word line selecting circuit with a voltage generated by said word line voltage generating circuit;

a plurality of sense amplifier circuits for detecting and amplifying the potential of said bit line and for holding data corresponding to the potential of the bit line; and a column selecting circuit for selectively outputting the data held in said sense amplifier circuits in response to a third data introduced into said memory device.

According to the eighth aspect of the present invention, there is provided a method for using a nonvolatile semiconductor memory device which includes a memory cell array having a plurality of nonvolatile memory cells arranged in a matrix in which memory cells in one row are connected by a common word line and memory cells in one column are connected by a common bit line, and a plurality of flag cells each associated with a memory cell group including a plurality of memory cells in said memory cell array to hold the number of data stored in a single memory cell in the associated memory cell group, comprising the steps of:

reading a flag data of a flag cell of a memory cell group to which a memory cell to be read belongs;

repeating a plurality of cycles of driving a word line connected to the memory cell with a predetermined voltage pursuant to the flag data of said flag cell, then detecting and amplifying a voltage of a bit line, and outputting the read-out data; and converting the data read out in said cycles into binary data.

According to the ninth aspect of the present invention, there is provided a nonvolatile semiconductor memory device comprising:

a memory cell array including a plurality of nonvolatile memory cells arranged in a matrix in which memory cells in one row are connected by a common word line, and memory cells in one column are connected by a common bit line, and data of one row can be read out for each divisional part thereof;

a serial resister aligned in parallel with said word lines in said memory cell array and capable of storing and reading individual divisional parts of data of the memory cell array independently; and a memory for storing data from said serial register for each divisional part.

BRIEF DESCRIPTION OF THE DRAWINGS

FIG. 15 is a diagram of still another modification of the invention;

FIG. 16 is a diagram of a modification of the invention during a reading process;

FIGS. 20A and 20B are a circuit arrangement of the encoder/decoder circuit;

FIGS. 25A–25G are explanatory diagrams of a reading operation in the embodiment shown in FIG. 21.

DETAILED DESCRIPTION OF THE PREFERRED EMBODIMENTS

A general aspect of a nonvolatile semiconductor storage device according to the invention is explained below with reference to FIGS. 1 through 4.

Figure 1:
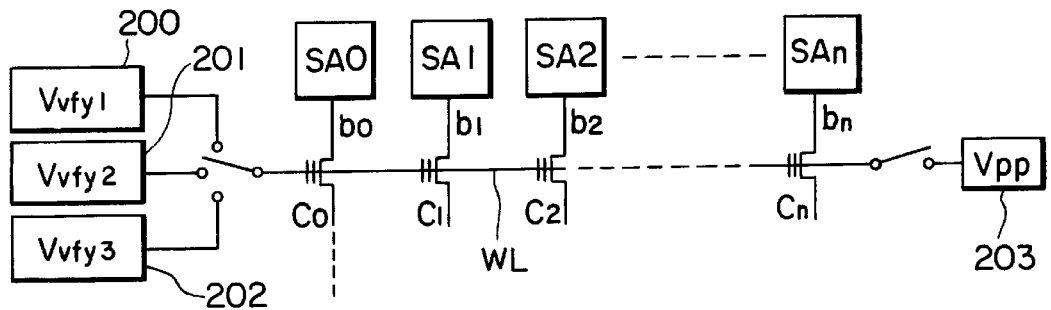
FIG. 1 is a circuit diagram of a multi-level memory according to an embodiment of the invention.

In FIG. 1, SA0 through SAn refer to sense amplifiers having a bit-to-bit verify function.

Memory cells C0 to Cn are nonvolatile memory cells made of two-layered gate MOS transistors which each have a source, a drain, both formed on a surface of a semiconductor substrate, a floating gate and a control gate, which are stacked on the source and the drain via an insulation film. In this embodiment using NAND memory cells as memory cells C0 to Cn, control gates of memory cells in a line are connected to a common word line WL.

The nonvolatile memory cells store multi-level information with two or more values depending upon values of threshold voltages variably controlled by injecting charges into their floating gates. For example, in a particular case where the word line driving voltage is 5 V, by determining a threshold value approx. −1 V as "11 " ("3"), another approx. 1.5 V as "10" ("2"), another approx. 3 V as "01" ("1"), and another approx. 4.5 V as "00" ("0"), then the memory cells behave as four-value storage means. If a threshold value around −1 V is regarded as "111" ("7"), another approx. 0.6 V as "110" ("6"), another approx. 1.2 V as "101" ("5"), another approx. 1.8 V as "100" ("4"), another approx. 2.4 V as "011" ("3"), another approx. 3.0V as "010" ("2"), another approx. 3.6 V as "001" ("1"), and another approx. 4.2 V as "000" ("0"), then the memory cells behave as eight-value storage means. The number of multiple levels may be other than $2^n$, such as five-value memory cells, in which a threshold value approx. −1 V may be defined as "100" ("4"), another approx. 1 V as "011" ("3"), approx. around 2 V as "010" ("2"), another approx. 3 V as "001" ("1"), and another approx. 4 V as "000" ("0"). Nevertheless, n multiples of 2 are recommended for easier conversion after reading.

Numerals 200 through 202 denote constant voltage generating circuits which output constant verify voltages Vvfy1, Vvfy2, Vvfy3, respectively. For storing four-value data in the memory cells as mentioned above, Vvfy 1 may be set to 1.5 V, Vvfy2 to 3.0 V, and Vvfy3 to 4.5 V. Actually, much more constant voltage circuits or reference voltage generating circuits are provided as explained later, so that multi-level storage from two values to eight values, for example, can be variably, selectively effected by executing writing and reading while setting the word line to a chosen potential.

Numeral 203 denotes a write voltage generating circuit for supplying the word line with a voltage Vpp (for example, the constant voltage of 20 V, or a voltage which stepwise increases by a predetermined value, like 16 V, 16.5 V and 17 V, every occurrence of writing.

Figure 2:
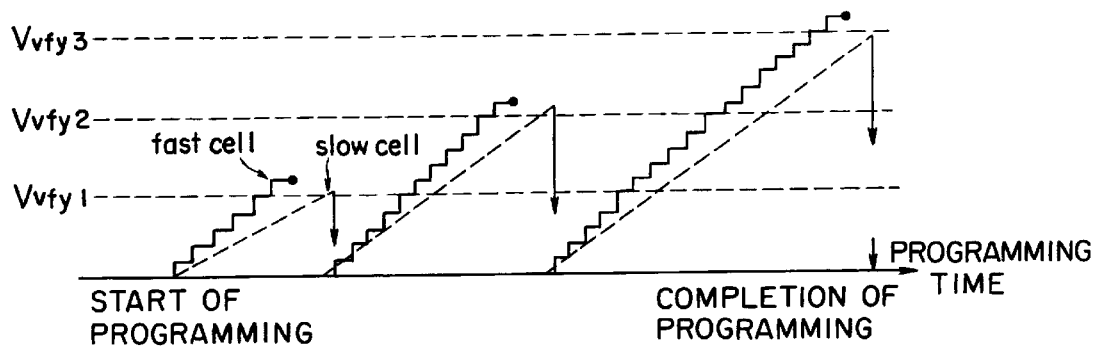
FIG. 2 is a diagram showing changes in threshold value during a writing process in the memory according to the embodiment of the invention.

Next explained is a writing process in the circuit of FIG. 1 with reference to FIG. 2. For four-value storage, writing operations in three steps. Before writing, erase is already finished, and the threshold value of memory cells is set to −1 V, for example. The value corresponds to "11" ("3"). FIG. 2 shows the progress of the program time and changes in threshold value with time of both a fast cell, in which writing is fast, and a slow cell, in which writing is slow because its insulation film is thick.

(Step 1): The following sub-steps 1-1 through 1-5 are repeated.

1-1: First data of a decoded value of write data is set in a write data latch in the sense amplifier. If the decoded value is "11" ("3"), then the first value is "1". If "10" ("2"), then "0". If "01" ("1"), then "1". If "00" ("0"), then "1". "1" corresponds to the write prohibit voltage, and "0" corresponds to the write voltage. That is, the write voltage is applied only to the bit line corresponding to the memory cell in which "10" is to be written, and the write prohibit voltage is applied to the bit lines corresponding to the other memory cells.

1-2: Vpp (20V) is applied to the word line WL, and writing is executed for the write time tp. More specifically, the voltage, 20 V, is applied to the word line, the write voltage, 0 V, is applied to the bit line corresponding to the memory cell for writing "10", and the write prohibit voltage, 10 V, is applied to the bit lines corresponding to the other memory cells. As a result, only the threshold value of the memory cell for writing "10" slightly increases, and the threshold values of the other memory cells remain unchanged.

1-3: The word line WL is driven up to Vvfy1 (1.5V) to execute a verify operation. That is, all bit lines are pre-charged to 5 V, and a time later, sense amplifiers detect the potentials of the bit lines. If the writing is finished, the write data latches in the sense amplifiers are inverted from "0" to "1".

1-4: Detection is done whether data is "1" in all of the write data latches. If so, the process ends.

1-5: If data is not "1" in one or more write data latches, vpp is increased by ΔVpp (for example, 0.5V) or the write time tp is increased by Δtp to prepare for subsequent steps 1-1 et seq. This step, however, may be omitted.

(Step 2): The following sub-steps 2-1 through 2-5 are repeated.

2-1: Second data of the decoded value of the write data is set in a write data latch in the sense amplifier. If the decoded value is "11", then the second value is "1". If "10", then "1". If "01", then "0". If "00", then "1". That is, the write voltage is applied only to the bit line corresponding to the memory cell in which "01" is to be written, and the write prohibit voltage is applied to the bit lines corresponding to the other memory cells.

2-2: Vpp (20 V) is applied to the word line WL, and writing is executed for the write time tp. As a result, only the threshold value of the memory cell for writing "01" slightly increases, and the threshold values of the other memory cells remain unchanged.

2-3: The word line WL is driven up to Vvfy2 (3.0 V) to execute a verify operation. That is, all bit lines are pre-charged to 5 V, and a time later, sense amplifiers detect the potentials of the bit lines. If the writing is finished, the write data latches in the sense amplifiers are inverted from "0" to "1".

2-4: Detection is done whether data is "1" in all of the write data latches. If so, the process ends.

2-5: If data is not "1" in one or more write data latches, Vpp is increased by ΔVpp (for example, 0.5 V) or the write time tp is increased by Δtp to prepare for subsequent steps. This step, however, may be omitted.

(Step 3): The following sub-steps 3-1 through 3-5 are repeated.

3-1: Third data of the decoded value of the write data is set in a write data latch in the sense amplifier. If the decoded value is "11", then the third value is "1". If "10", then "1". If "01", then "1". If "00", then "0". That is, the write voltage is applied only to the bit line corresponding to the memory cell in which "00" is to be written, and the write prohibit voltage is applied to the bit lines corresponding to the other memory cells.

3-2: Vpp (20 V) is applied to the word line WL, and writing is executed for the write time tp. As a result, only the threshold value of the memory cell for writing "00" slightly increases, and the threshold values of the other memory cells remain unchanged.

3-3: The word line WL is driven up to Vvfy3 (4.5 V) to execute a verify operation. That is, all bit lines are pre-charged to 5 V, and a time later, sense amplifiers detect the potentials of the bit lines. If the writing is finished, the write data latches in the sense amplifiers are inverted from "0" to "1".

3-4: Detection is done whether data is "1" in all of the write data latches. If so, the process ends.

3-5: If data is not "1" in one or more write data latches, vpp is increased by ΔVpp (for example, 0.5 V) or the write time tp is increased by, Δtp to prepare for subsequent steps. This step, however, may be omitted.

It is understood that multi-level writing is done by execution of the above three steps. In short, data of a decoded value are, in the order of the first, second and third data, "111" for "3", "011" for "2", "101" for "1", and "110" for "0". In case of three-value storage, "2" is decoded into "11", "1" into "01", and "0" into "10". In case of five-value storage, "4" is decoded into "1111", "3" into "0111", "2" into "1011", "1" into "1101", and "0" into "1110". Generalizing it by using n, "n" is decoded into "1111 . . . 11", "n−1" into "0111 . . . 11", "n−2" into "1011 . . . 11", "1" into "1111 . . . 01", and "0" into "1111 . . . 10". The threshold value is lowest for "n" and highest for "0".

In this process decoding writing data as explained above and using the decoded data sequentially as write data so as to increase the threshold values of memory cells little by little and to give the word line a potential corresponding to the write data for execution of write verify, it is possible to store any desired multi-level in a single memory cell. For reading, a slightly lower potential than the verify potential is supplied to the word line. Thus, "3" is read out as "000", "2" as "100", "1" as "110", and "0" as "111", in sequence, and they are encoded to form a multi-level data. In general, "n" read as "0000 . . . 00", "n−1" read as "1000 . . . 00", "n−2" read as "1100 . . . 00", "1" read "1111 . . . 10", and "0" read as "1111 . . . 11" are encoded into a multi-data.

By employing the above-explained write and read system, the following effects are obtained.

1. The area for sense amplifiers may be small. That is, a single sense amplifier is sufficient regardless of the numbers of multiple levels.

2. Since a plurality of constant voltage circuits 200 through 202 are used in lieu of reference cells, the number of multiple levels is variable.

As a result, an architecture for multi-level flash memory can be provided which can flexibly cope with any number of multiple levels and can minimize the chip size.

Figure 3:
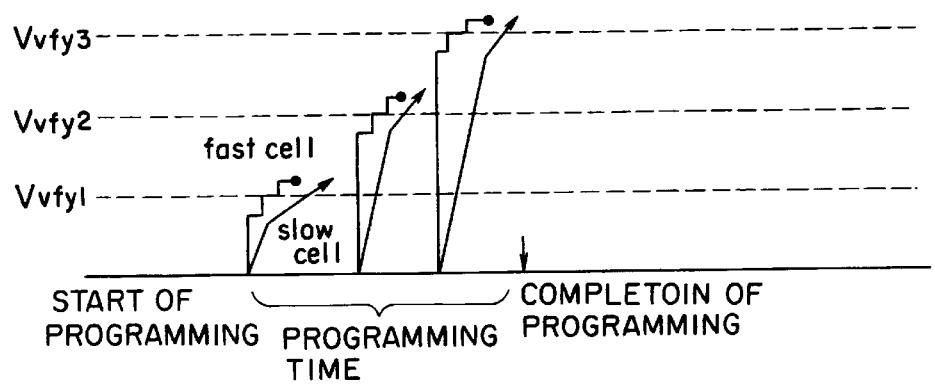
FIG. 3 is a diagram showing changes in threshold value during another writing process in the memory according to the embodiment of the invention.

Shown in FIG. 3 is another write method. This method employs the same write data decode method as shown above, but enhances the writing in first cycles in steps 2 and 3 (by increasing the initial value of Vpp or by elongating the initial value of the write time). As a result, the total write time can be reduced.

Figure 4:
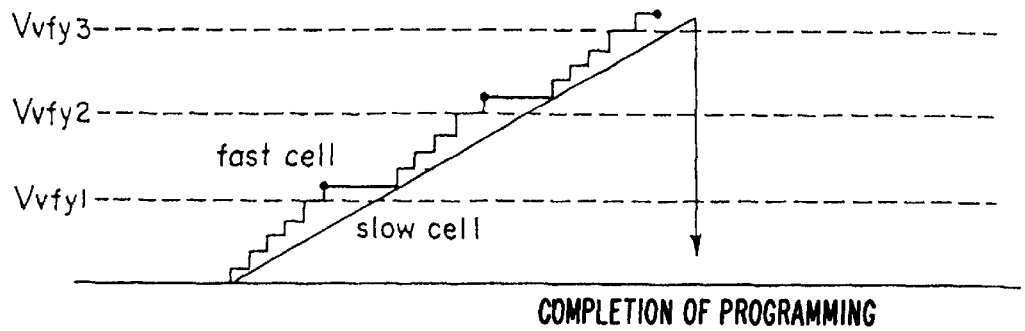
FIG. 4 is a diagram showing changes in threshold value during another writing process in the memory according to the embodiment of the invention.

Shown in FIG. 4 is still another write method. This method employs a different way of decoding. That is, for writing data for four-value storage, "3" is decoded into "111", "2" into "011", "1" into "001", and "0" into "000". In general, "n" is decoded into "1111 . . . 11", "n−1" into "0111 . . . 11", "n−2" into "0011 . . . 11", "1" into "0000 . . . 01", and "0" into "0000 . . . 00". As a result, the write time is reduced as shown in FIG. 4.

Figure 5:
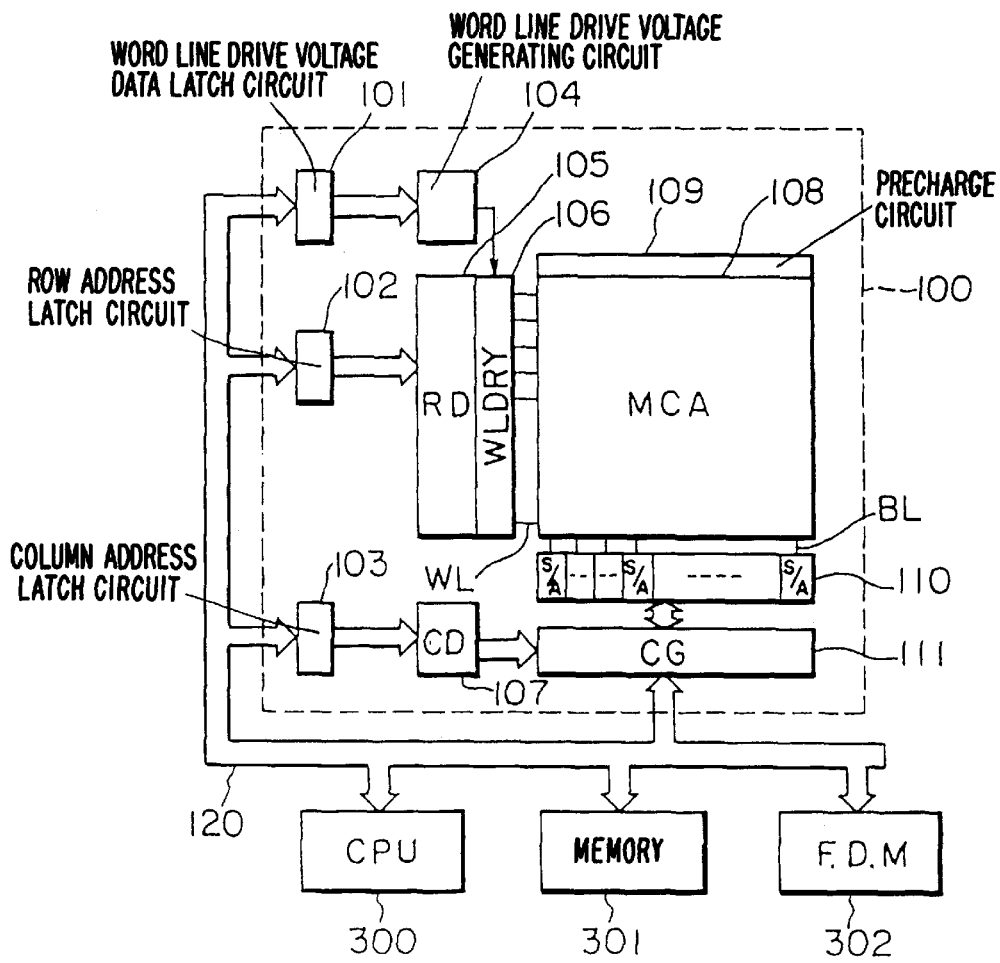
FIG. 5 is a circuit arrangement of a nonvolatile semiconductor storage device according to the embodiment of the invention.

Next explained are details of a circuit arrangement of an embodiment of the invention with reference to FIG. 5. The memory system according to the embodiment generally comprises a multi-level memory 100, CPU 300, RAM 301, and flag data memory 302. These elements are connected by a bus 120, control signal line 121, and so forth.

The multi-level memory 100 includes a word line drive voltage data latch circuit 101, row address latch circuit 102, column address latch circuit 103, word line drive voltage generating circuit 104, row decode circuit 105, word line drive circuit 106, column decode circuit 107, memory cell array 108, precharge circuit 109, sense amplifier array 110, column gate 111, and so forth.

The bus 120 has a bit width of, for example, eight bits. The word line drive voltage data latch circuit 101, row address latch circuit 102, and column address latch circuit 103 are of eight-bit latch.

The memory cell array 108 has the capacitance of 64M elements made by arranging two-layered gate MOS transistors in a matrix with 32K rows and 2K columns. The memory cells have a NAND arrangement.

Figure 6:
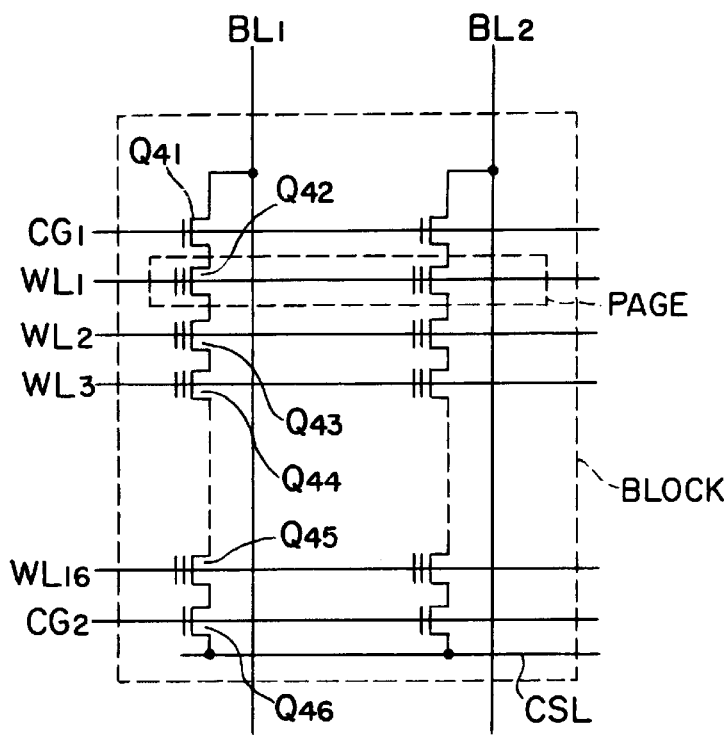
FIG. 6 is a circuit diagram of memory cells according to the embodiment of the invention.

FIG. 6 shows an arrangement of NAND memory cells. The NAND memory cells are made up of a MOS transistor Q41 whose gate is driven by a drain-side select gate line SG1, two-layered gate MOS transistors Q42 to Q45 whose gates are driven by word lines WL, and MOS transistor Q46 whose gate is driven by a source-side select gate line SG2. A single memory cell array 108 includes 2K rows and 2K columns of NAND bundles. Memory cells in one row (memory cells connected to a single word line) forms one page (2K bits), and NAND bundles aligned in the direction of columns form one block (32K bits). A single 64 M-bit memory cell array includes 2K blocks.

Figure 7:
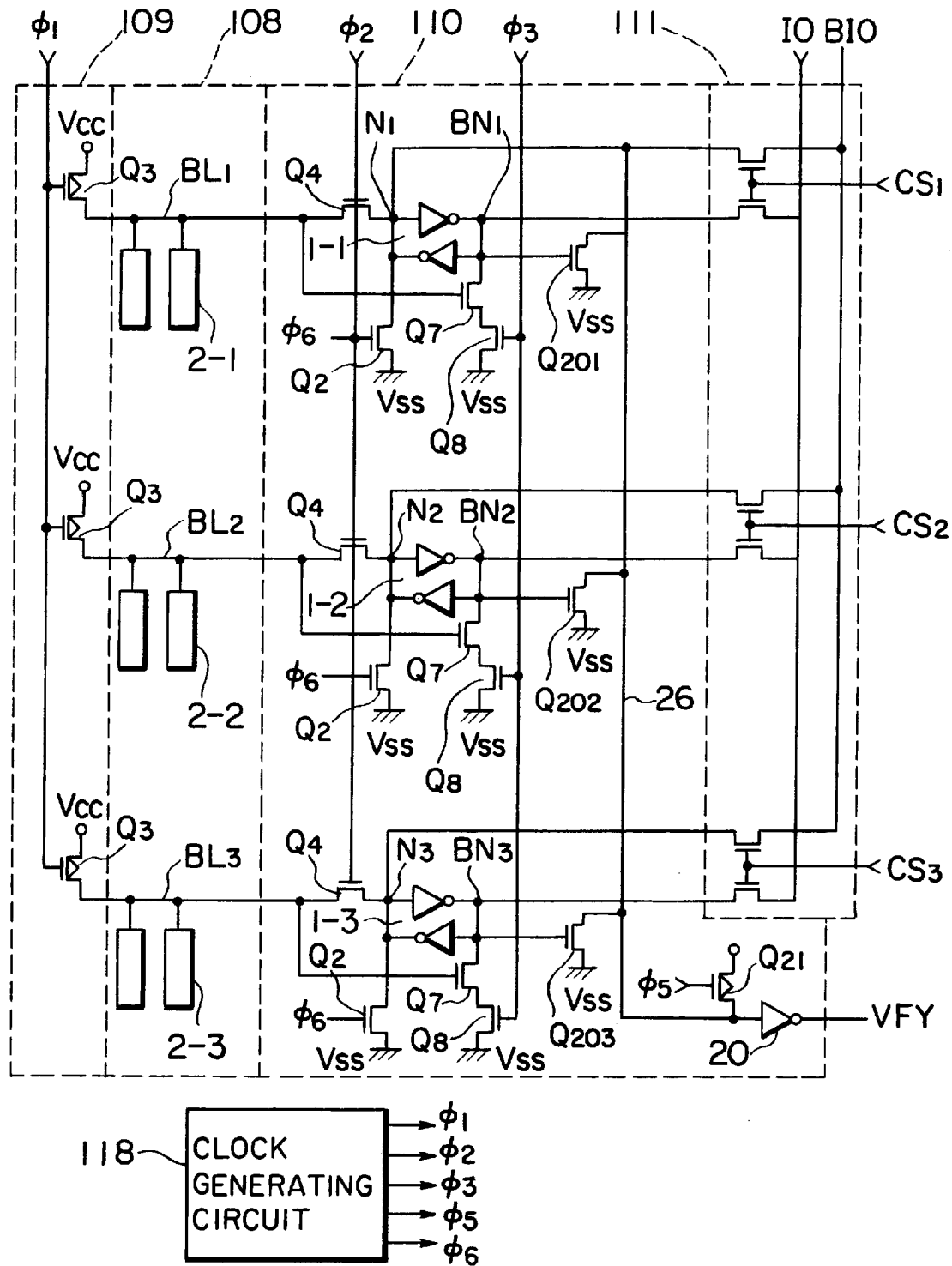
FIG. 7 is a circuit diagram of a major part of the embodiment of the invention.

An arrangement of the memory cell array 108, precharge circuit 109, sense amplifier array 110, column gate circuit 111, and so on, is shown in FIG. 7. As explained above, the arrangement includes 2K bit lines; however, the drawing shows only three bit lines. The precharge circuit 109 is composed of a P-type MOS transistor Q3 controlled by a signal φ1. NAND bundles 2-1 to 2-3 have the arrangement shown in FIG. 6. The sense amplifier array 110 includes a plurality of sense amplifier circuits S/A. Each sense amplifier circuit is made up of flip-flop circuits 1-1 to 1-3, N-type MOS transistors Q2, Q4, Q7, Q8, and includes batch verify detecting circuit made of Q201 through Q203, Q21 and inverter circuit 20. The column gate circuit 111 selectively connects the flop-flop circuits to a IO line pair connected to the bus 120 under control of column selecting lines CS.

The flip-flop circuits 1-1 to 1-3 behave as write data latches and read data latches. That is, they behave as write data latch during data writing.

Writing is effected in the following steps. For an increase of the threshold value of memory cells (program), i.e. for writing "0", "L" is supplied to IO, and "H" to BIO (IO line having negative logic). Thus, the node N1 of the flip-flop circuit 1-1 is set to "L", and BN1 to "H". After that, the source level of the flip-flop is increased to give the increased "H" level to the signal φ2. Thus, the MOS transistor Q4 is made conductive, and the bit line becomes 0 V. After that, by increasing the voltage of the word line to 20 V, the potential difference between the control gate of the selected memory cell and the channel becomes 20 V, and the threshold value increases due to entry of electrons into the floating gate.

After that, the following verification operation is effected. The signal φ1 is set to "L" level to make the MOS transistor Q3 conductive and to precharge the bit line BL with 5 V. Then, a potential of a verify level (determined between 0 V to 5 V depending on the write multi-level data as explained above) is supplied to the word line WL of the written memory cell. A time later, the charge on the bit line is discharged the ground terminal (common source line CSL) depending on the threshold value of the memory cell. The MOS transistor Q8 is conducted by setting the signal φ3 to "H" to detect the potential of the bit line BL at this time. As a result, conduction of the MOS transistor Q7 is controlled depending on the bit line potential so that the flip-flop is inverted if the bit line maintains the "H" level, but is not inverted if the bit line potential is already discharged. This is responsive to the flip-flop being inverted upon completion of writing. As already explained, the foregoing writing behaviors are repeated bit by bit to sequentially increase the threshold value of the memory cell.

When the threshold value of a memory cell is held constant, that is, for writing "1", "H" is supplied to IO, and "1" to BIO. Thus, the node N1 of the flip-flop circuit 1-1 is set to "H", and BN1 to "1". After that, the source level of the flip-flop in increased, and the increased "H" level (10 V) is given to the signal φ2. Then, the MOS transistor Q4 is made conductive, and the bit line is set to 10 V. After that, by increasing the voltage of the word line to 20 V, the potential difference between the control gate of the selected memory cell and the channel becomes 10 V, and the threshold value maintains a constant value because electrons are block out from the floating gate. In the following verify operation, the flip-flop maintains the latest status regardless of any potential of the bit line. These behaviors are conducted not only for writing "1" but also in steps taken after writing "0" is completed.

Detection whether the writing is finished is done by the batch verify detecting circuit. That is, by giving the "L" pulse to φ5 and by making the MOS transistor Q21 conductive, the common verify line 26 is precharged to "H". If writing is not finished in one or more cells, the node BN exhibits "H" level because the node BN of a cell in which writing is not done or completed should exhibit the "L" level. Therefore, if there is any cell in which writing is not completed, one of the MOS transistors Q201 through Q203 is conducted, and the common verify line 26 exhibits "L". When writing is completed in all of the cells, then the common verify line 26 exhibits "H". In this manner, as long as the output VFY of the inverter circuit 20 maintains "H", writing is not yet completed, and VFY is changed to "L" only when writing is completed.

Reading is done in the following steps. A "H" pulse is given as signal φ6, N1 is set to "L", and BN1 to "H". After that, signal φ1 is set to the "L" level to makes the MOS transistor Q3 conductive, and the bit line BL is precharged to 5 V. Then, the read level potential (determined between 0 V to 5 V depending on the write multi-level data as explained above) is supplied to the word line WL of the selected memory cell. A time later, the charge on the bit line is discharged to the ground terminal (common source line CSL) depending on the threshold value of the memory cell. The MOS transistor Q8 is conducted by setting the signal φ3 to "H" to detect the potential of the bit line BL at this time. As a result, conduction of the MOS transistor Q7 is controlled depending on the bit line potential so that the flip-flop is inverted if the bit line maintains the "H" level, but is not inverted if the bit line potential is already discharged. In this manner, when the threshold value of the memory cell is higher than the potential of the word line, the bit line level becomes "L", the MOS transistor Q7 is not conducted, and the node N1 maintains "L". This is called "0" reading.

When the threshold value of the memory cell is higher than the potential of the word line, the bit line level becomes "H", the MOS transistor Q7 is conducted, and the node N1 exhibits the "H" level. This is called "1" reading.

Figure 8:
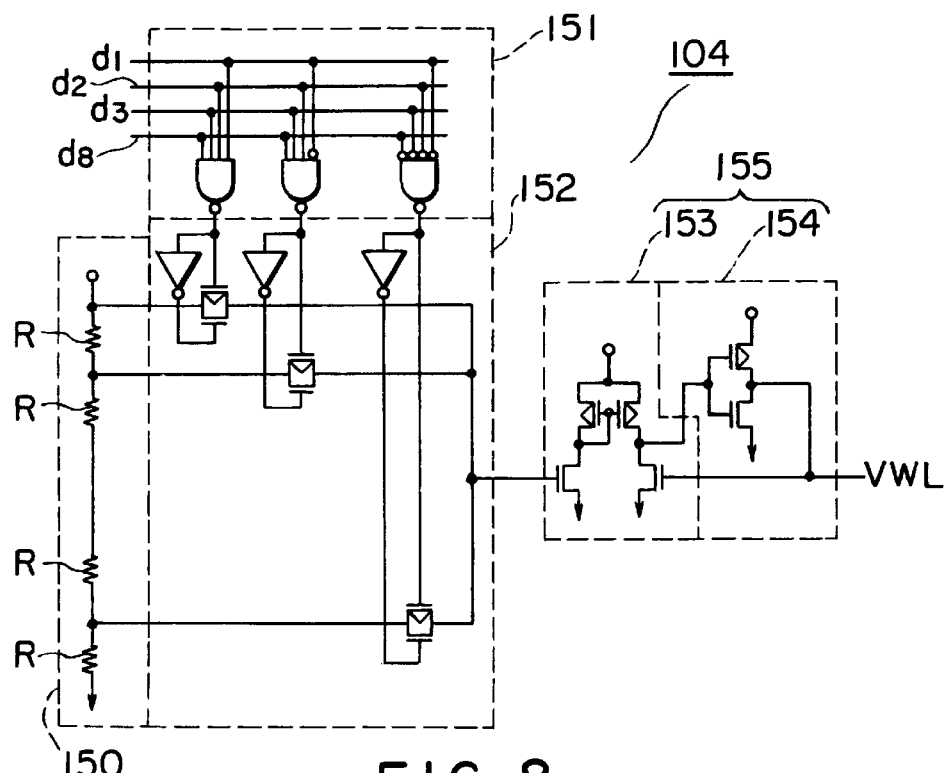
FIG. 8 is a circuit diagram of a major part of the embodiment of the invention.

The word line drive voltage generating circuit 104 has the arrangement shown in FIG. 8, which includes a decode circuit 151, reference voltage generating circuit 150, transfer gate circuit 152, current mirror comparator circuit 153, drive inverter circuit 154, and so forth.

The decode circuit 151 decodes data d1 to d8 latched in the word line drive voltage data latch circuit 101 and generates 256 outputs (which may be less).

The reference voltage generating circuit 150 is made by serially connecting plural steps of resistor elements R, and outputs a predetermined potential by resistive division.

The divided reference potential output is supplied through 256 transfer gates (which may be less) to a source follower circuit formed of the current mirror comparator circuit 153 and the drive inverter circuit 154. In this process, a word line drive voltage VWL is generated.

Figures 9, 11:
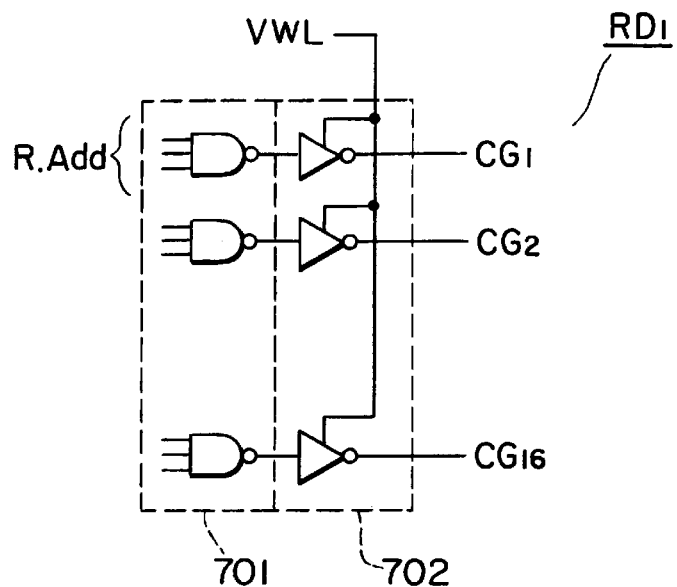
FIG. 9 is a circuit diagram of a major part of the embodiment of the invention.
FIG. 11 is a table of voltages applied during operation of the circuit shown in FIG. 10.

Next explained are details of the row decode circuit 105. The row decode circuit 105 employs a partial decode method, and includes an intra-block decode circuit RD1 and a block decode circuit RD2. FIG. 9 shows details of a circuit arrangement of the intra-block decode circuit RD1. This circuit includes a decode portion for decoding a row address R.Add and a CG drive circuit 702 supplied with by the word line drive voltage VWL. The intra-block decode circuit RD1 determines whichever word line is to be selected among the NAND bundles.

Figure 10:
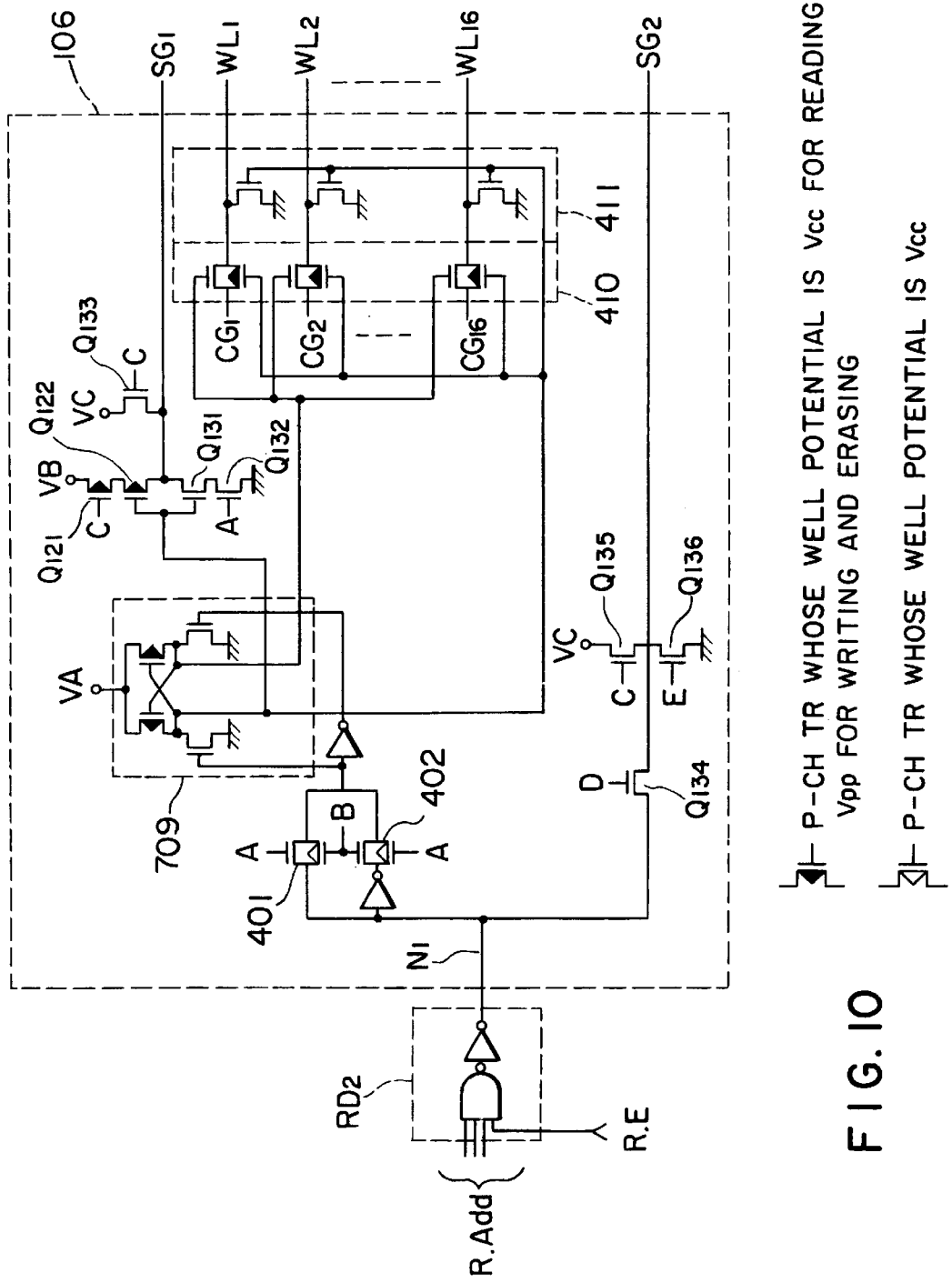
FIG. 10 is a circuit diagram of a major part of the embodiment of the invention.

FIG. 10 shows details of a block decode circuit RD2 and the word line drive circuit 106.

The block decode circuit RD2 decodes a row address R.Add (which is different from the row address input to the intra-block decode circuit RD1 and may be, for example, an upper address), and selects a block.

The word line drive circuit 106 is made of transfer gates 401, 402, 410, MOS transistors Q134, Q135, Q136, Q121, Q122. Q131, Q132, Q133, level shifter 709, word line ground circuit 411, and so forth.

The word line drive circuit 106 of the block selected by the block decode circuit RD2 drives word lines WL1 through WL16 in response to CG1 to CG16 signals. Potentials applied to signals A to E and power sources VA, VB, VC are shown in FIG. 11. Vpp represents 20 V, Vm 10 V, Vcc 5 V, and GND 0 V.

Returning back to FIG. 5, RAM 301 is for temporarily storing data, etc. to be written, and the flag data memory 302 is a nonvolatile memory for storing the number of multiple levels of respective blocks in the memory cell array 108. In case of a memory cell array having a small capacitance, characteristics of a single memory cell array is considered uniform, and the maximum number of multiple levels is considered constant in any cell. In contrast, in 64M memory cells, for example, there may possibly be a variance in maximum number of multiple levels depending upon the locations of the memory cells, but multiple levels are considered substantially the same in adjacent memory cells. Since the flag data memory 302 stores multiple levels of respective blocks in the memory cell array 108, multiple levels can be set independently in individual blocks. For example, blocks 1 to 20 can be used as a three-level memory, blocks 20 to 40 as a four-level memory, blocks 40 to 2000 as a five-level memory, blocks 2000 to 2020 as a four-level memory, and blocks 2020 to 2048 as a three-level memory. CPU 300 executes read/write control, data transfer control, write data decoding, read data encoding (data conversion), and so forth.

When all memory cells in one chip are used for the same multi-level storage, no flag data memory is necessary. For example, if they are used as a four-level memory, CPU may control such that both reading and writing are always performed in three steps.

Figure 12:
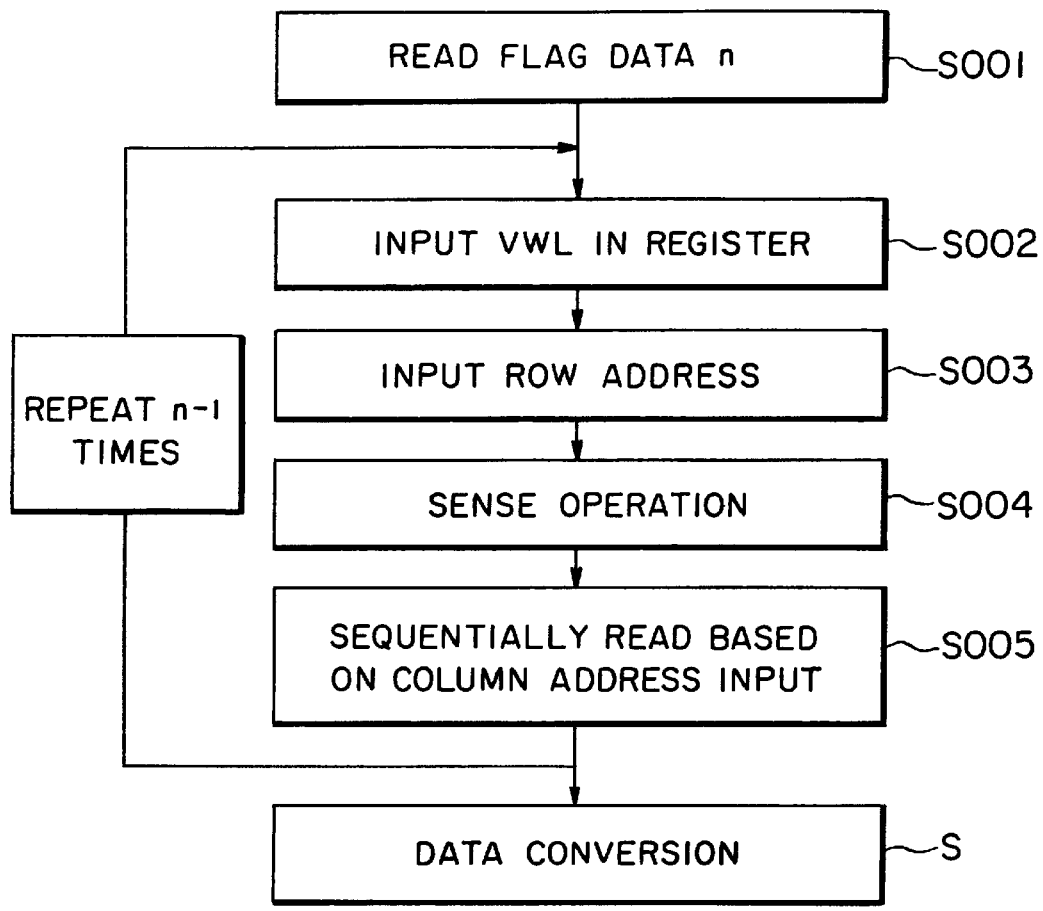
FIG. 12 is a flow chart of a reading operation in the embodiment of the invention.

Referring to FIG. 12, behaviors of the memory system shown in FIG. 5 are explained below. FIG. 12 is a flow chart of a reading process.

Flag data is first read out (S001). If, for. example, data of memory cells in the block 1 is to be read, flag data in the flag data memory 302 corresponding to the block is read out. The flag data indicates the multi-level number n of the block. For example, if the memory cells in the block 1 is a three-level memory, then n is 3. After that, CPU 300 latches data indicating the first verify voltage corresponding to the multi-level number n in the word line drive voltage data latch circuit 101 (S002). Then, the word line drive voltage generating circuit 104 outputs 1.8, for example, corresponding to the data. Next, a row address is input (S003). Since it requires more than eight bits, the address data must be transferred in two cycles. After that, the word line is driven by 1.8 V to perform a sense operation (S004). As a result, if the stored data is "2", then "0" is latched in the flip-flop in the sense amplifier. If it is "1", then "1" is latched. If it is "0", then "1" is latched. The data is sequentially read out by changing the column address, and stored in RAM 301 (S005). These steps S002 to S005 are repeated once again (normally n–1 times).

The second cycle is progressed in the same manner except that the word line voltage is 3.6 V. As a result, if the stored data is "2", "0" is latched in the flip-flop in the sense amplifier. If it is "1", then "0" is latched. If it is "0", then "1" is latched. Then, the data is stored in RAM 301.

After that, a stream of bits is generated by encoding the data stored in RAM 301. An algorithm for converting a ternary number (three-bit information) into a binary number is used (S006). In this example, CPU and software for controlling the CPU are used to execute encode and decode operations; however, these operations may be done by hardware as shown in FIGS. 19, 20A and 20B.

Figures 18, 19:
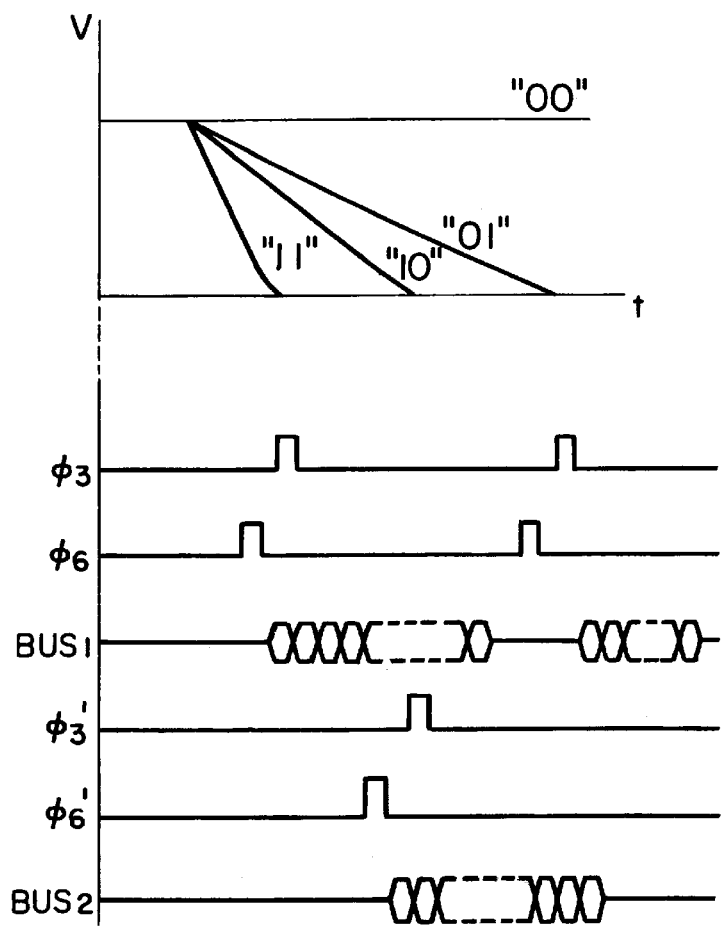
FIG. 18 is a diagram of a modification of the invention using the circuit of FIG. 17 during a reading process.
FIG. 19 is a table showing operations of an encoder/decoder circuit.

FIG. 19 is a table showing relations between a stream of data bits D0, D1 and a stream of data d0, d1, d2 which are decoded from D0, D1, stored in RAM 301 and transferred to the memory cell array. FIGS. 20A and 20B are circuit diagrams for realizing an encode operation and a decode operation. The circuit of FIG. 20A is for realizing a decode operation and includes an AND circuit AND11, OR circuit OR11, and so forth. The circuit of FIG. 20B is for realizing an encode operation and includes AND circuits AND 12, AND13, OR circuit OR12, inverter circuits INV11, INV12, and so forth.

Figure 13A:
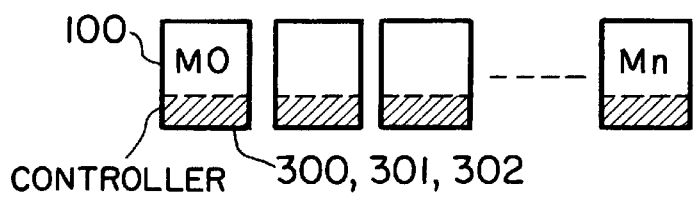
FIGS. 13A and 13B are diagrams showing a modification of the invention.
Figure 13B:
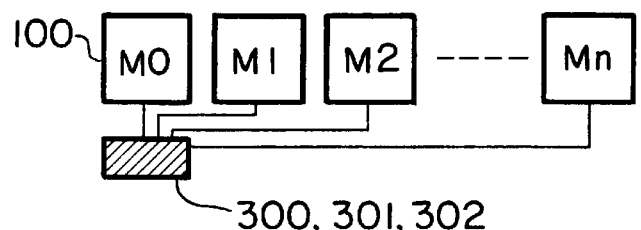

FIGS. 13A and 13B show a system arrangement with a large capacitance using the above system. FIG. 13A shows an example using a plurality of chips, in which the multi-level memory 100, CPU 300, RAM 301, flag data memory 302 among elements in the circuit of FIG. 5 are incorporated into each single chip. FIG. 13B shows another example in which the controller portion (CPU 300, RAM 301 and flag data memory 302) is disposed on another single chip. When the encoder/decoder circuits of FIGS. 20A and 20B are used, they should be shared as a common control circuit.

Other than this arrangement, a number of multi-level memory chips may be mounted on a board or a card while the other elements including the controller is incorporated on another board In this case, by using the controller commonly, the storage capacitance can be increased as desired. Of course, the controller may be composed of plural chips.

Figure 14:
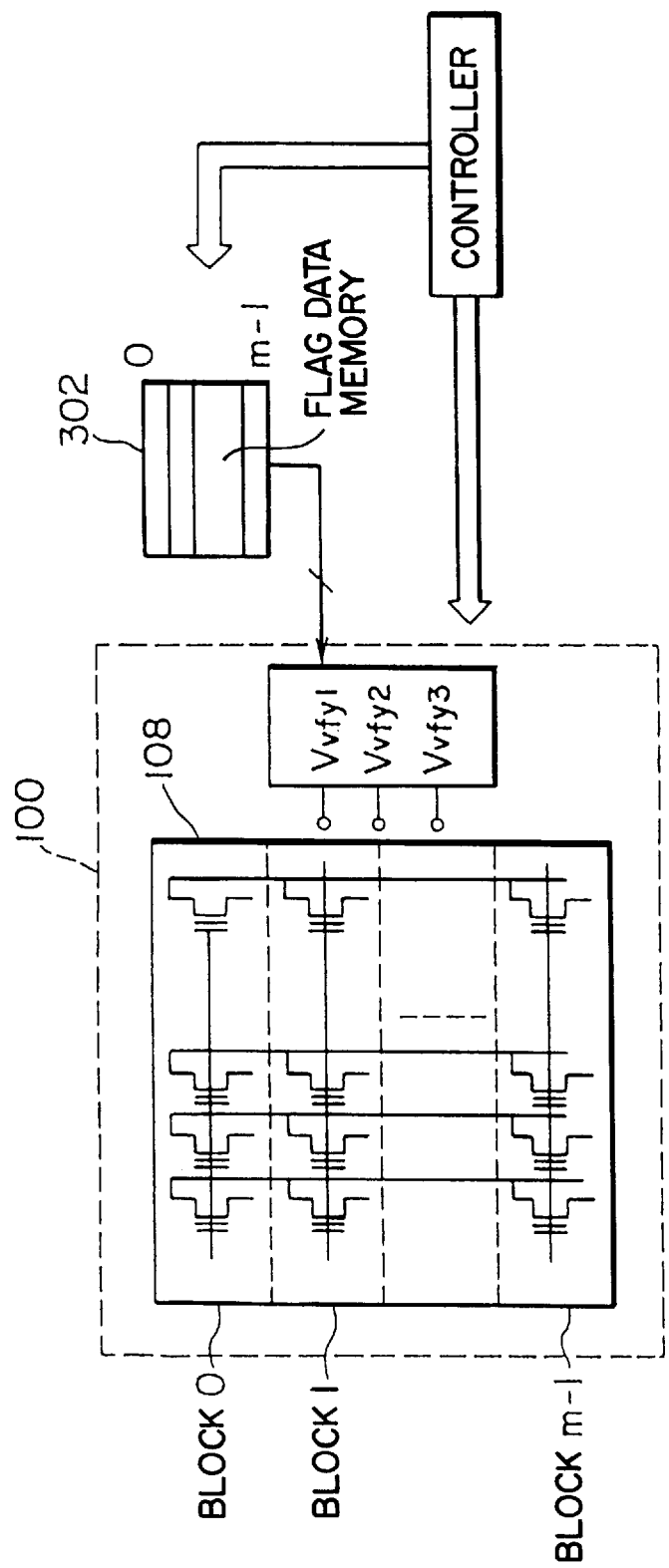
FIG. 14 is a diagram of another modification of the invention.

FIG. 14 shows an example in which one block is for one word line. The block is smaller than that of FIG. 5, and the total amount of data that can be stored in one chip can be increased.

FIG. 15 shows an example in which each chip has the flag data memory 302. This arrangement facilitates extension of the system. If memory cells in one chip are not divided into blocks and always used for storage of the same multi-level number, then a single nonvolatile register is sufficient in one chip to store in the nonvolatile register a multi-level number common to all memory cells in one chip.

A memory system having the arrangement shown in FIGS. 13A, b through 15 will be brought into commerce in a unique way different from the conventional sale.

In a first possible case, the manufacturer probably tests the multi-level number of each chip. According to the result of the test, certain multi-level numbers within a guaranteed range are previously stored in nonvolatile multi-level registers.

In a second possible case, memory cells in one chip are probably divided into blocks. If the memory should be designed to use different blocks for different multi-level numbers, multi-level numbers will be previously stored in respective blocks with reference to the result of a test by the manufacturer.

In a third possible case, all of the above test may be relied on user's job. In this case, a user determines multi-level numbers On his own responsibility.

Through these ways of sale, it will be possible to supply a much less expensive memory than other type memories.

As described above, when CPU 300 (decoder/encoder) is provided externally of RAM chips, the performance is inevitably deteriorated because three read cycles must be repeated for four-level storage and seven read cycles for eight-level storage. FIG. 16 shows a read process improved in this respect.

First, bit lines are precharged to set word lines to a highest Vvfy level. At time t1 when cells of "11" discharge the bit lines, the $\phi 3$ pulse of sense amplifiers is made to rise, and corresponding information of the bit lines is latched. At this time, since sense amplifiers other than "11" are inverted from the reset status, bit lines corresponding to "11" can be known. By using this method for all sense amplifiers, information is read out and stored in RAM 302 in the controller before cells of "10" discharge the bit lines. By executing it for "10" and "01" as shown in FIG. 16, all information can be read by a single precharge.

Figure 17:
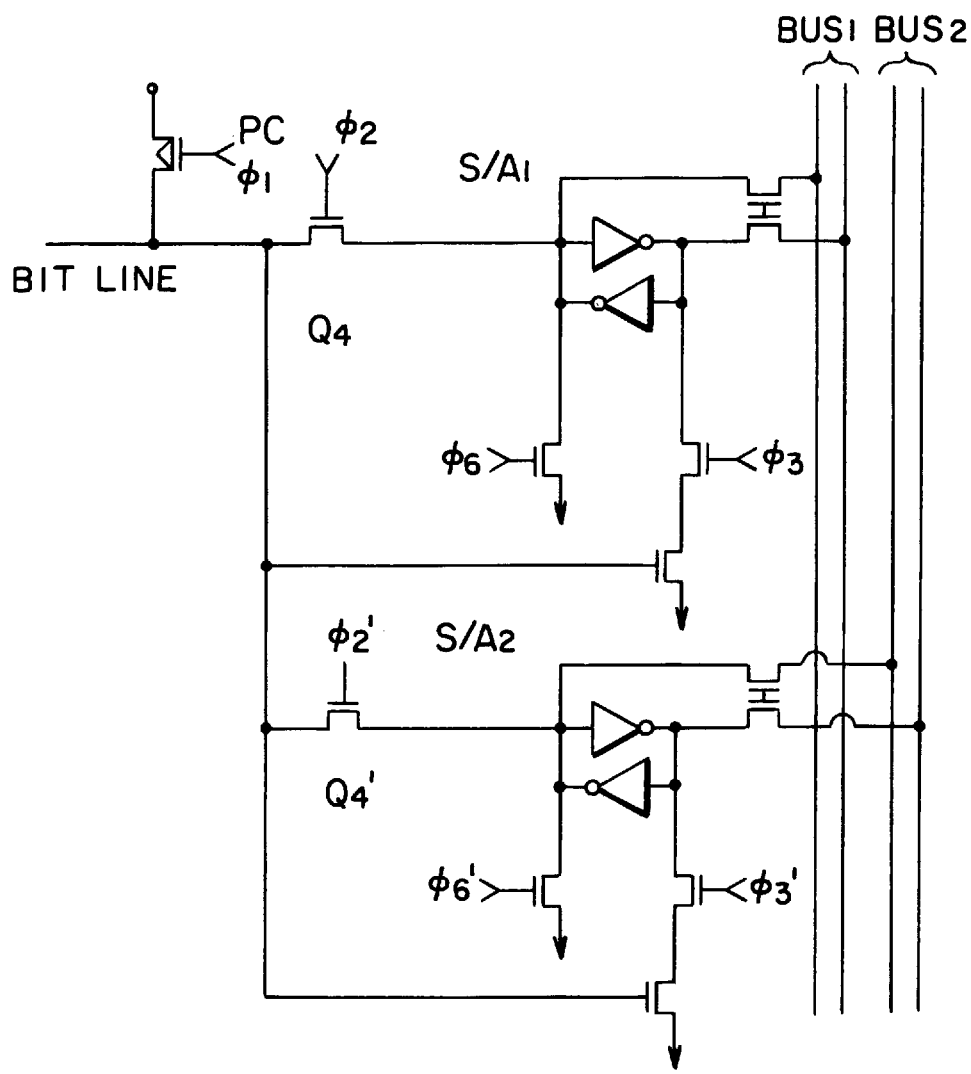
FIG. 17 is a circuit diagram of yet another modification of the invention.

This method of reading must read out all information within a time for discharging data of adjacent cells, and involves a difficulty in respect of timing. As a result, along with an increase in amount of information, a significantly high speed is required for serial access. FIG. 17 shows a countermeasure in this respect.

In this arrangement, two sense amplifiers are provided for each bit line for two-way access. That is, the sense amplifier S/A1 reads data corresponding to "11" and "01" alone, and "10" between them is latched by the sense amplifier S/A2. Although this arrangement needs two couples of data bus lines, a single couple of data bus lines is also acceptable if they are alternatively made to appear on the data bus by appropriate switching of the column gates.

In this case, if the same method is used for data load during program, two MOS transistors, Q4 and Q4', must be used However, in a specification where slower data load is acceptable, bit-to-bit verify writing may be done by the sense amplifier S/A1 alone, and the MOS transistor Q4'may be omitted.

FIGS. 21 through 25 show still further embodiments of the invention, which are improved in read speed.

Figure 21:
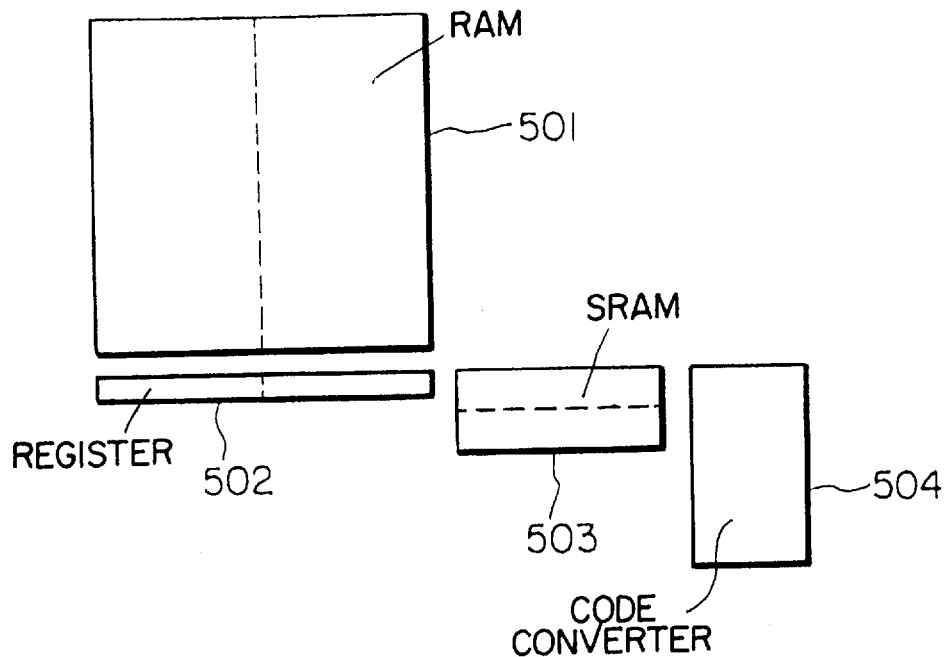
FIG. 21 is a block diagram of an embodiment improved in reading speed.

FIG. 21 is a block diagram schematically showing a nonvolatile semiconductor memory device according to the invention. As shown, the device includes a RAM portion 501 in which NAND flash memory cells are arranged in a matrix, register 502 aligned in parallel with word lines of the RAM portion, external SRAM 503 for storing contents of the register, and code converting portion 504 for converting read-out data into binary data. The RAM portion 501 is a multi-level (maximum value is n) memory of 1K word by 1K bits, and the register also has the capacity of 1K bits. The register is divided into two parts of 512 bits as explained later. The external SRAM has the capacity of 1K bits x (n−2) rows.

Figure 22:
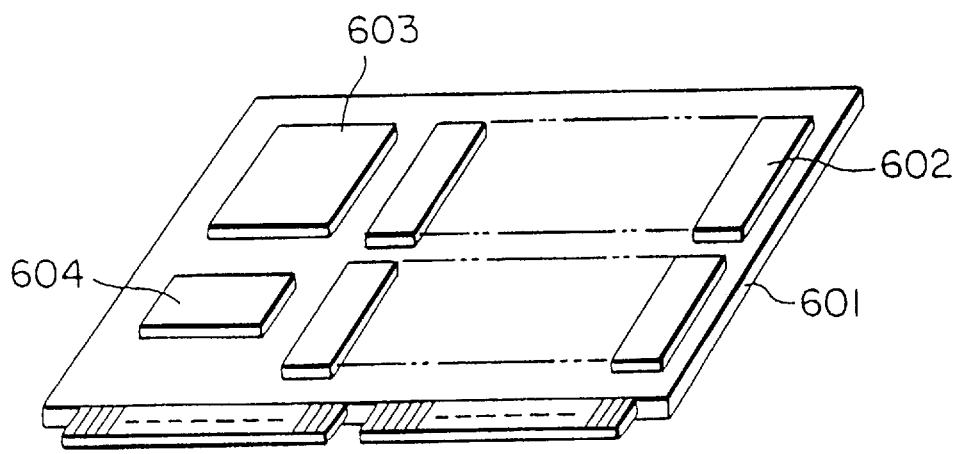
FIG. 22 is a perspective view of a memory board realizing the arrangement of FIG. 21.

FIG. 22 is a perspective view of the outer aspect of a memory board as an actual memory device which includes a plurality of RAM chips 602, CPU chip 603 and SRAM chip 604 mounted on a major surface of a substrate 601.

Figure 23A:
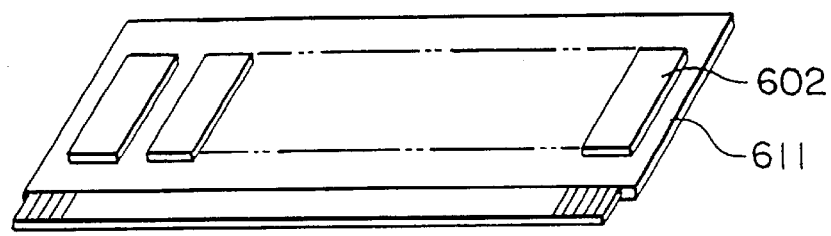
FIGS. 23A and 23B are a perspective view and a front elevational view of another memory board realizing the arrangement of FIG. 21.
Figure 23B:
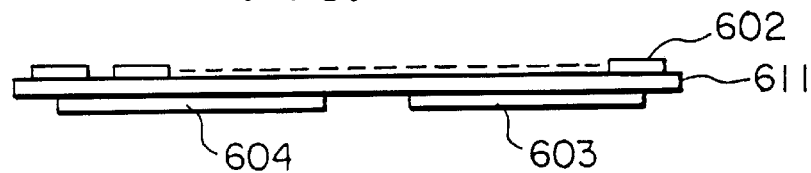

FIGS. 23A and 23B show another example of the memory board, in which FIG. 23A is a perspective view taken from the front surface and FIG. 23B is a front elevational view. In this example, a plurality of RAM chips 602 are mounted on the front surface of a substrate 611, and the CPU chip 603 and the SRAM chip 604 are mounted on the back surface.

Figure 24:
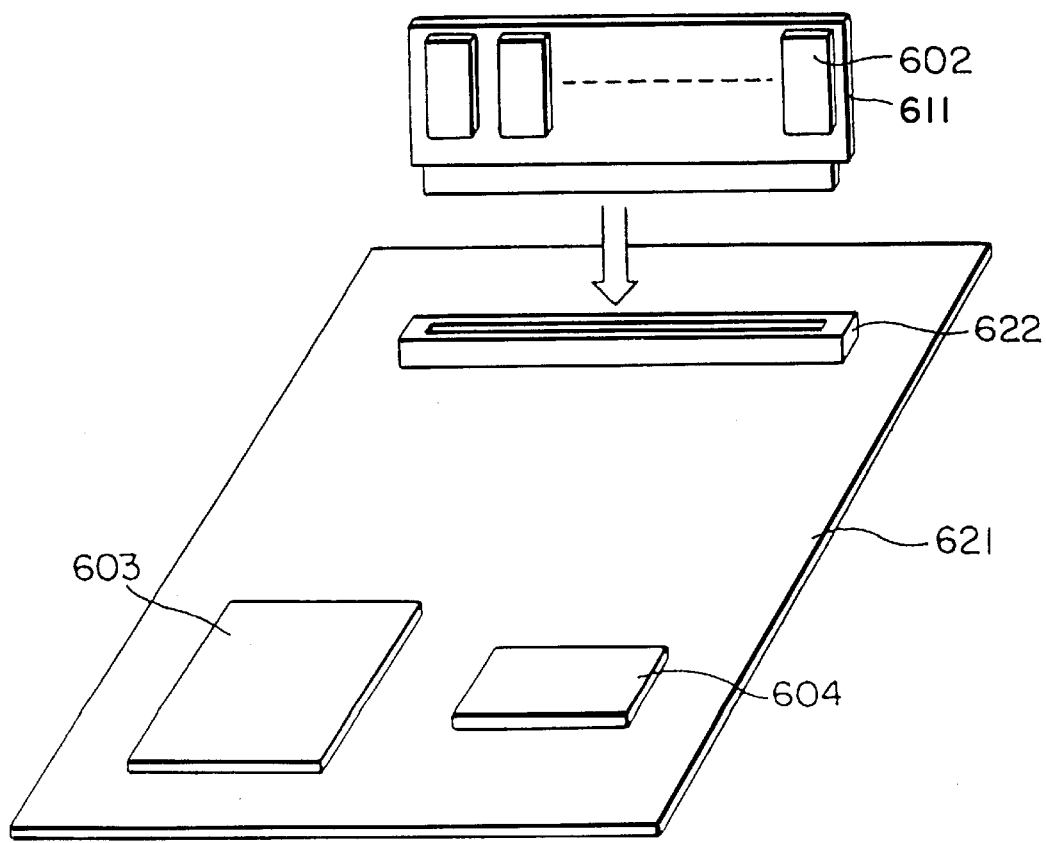
FIG. 24 is a perspective view of still another memory board realizing the arrangement of FIG. 21.

FIG. 24 shows still another example in which the CPU chip 603, SRAM chip 604 and connector 622 are mounted on a mother board substrate 621, and a memory board having a plurality of RAM chips 602 is connected to the connector 622.

Although the devices shown in FIGS. 22 through 24 are realized in form of memory boards, they may be realized as standardized memory cards.

FIGS. 25A–25G show operations of the embodiments when four-level data (n=4) to be stored in the RAM.

Here is used a scheme of pipeline. Data VWL0 of a word line WL0 is first read and stored in the register 502 (FIG. 25A). Then, the VWL0 data of the least-significant half of the register 402 (least-significant 512 bits) is serially read out and transferred to the first row of the external SRAM 503 (FIG. 25B). Next, the row address is progressed, and data VWL1 of the word line WL1 is read out. In this step, only the least-significant half is read and stored in the least-significant portion of the register 502. At the same time, VWL0 data stored in the most-significant portion of the register 502 is transferred to the first row of the external SRAM 503 (FIG. 25C). After that, the least-significant half VWL1 data stored in the register 502 is transferred to the second row of the external SRAM 503, and the most-significant portion of VWL1 data is stored in the most-significant half of the register 502 (FIG. 25D). By progressing the row address of the RAM portion 501 once again, while the most-significant half of VWL1 data stored in the register 502 is transferred to the second row of the external SRAM 503, the least-significant portion of VWL2 data is stored in the least-significant half of the register 502 (FIG. 25E). Next, while the most-significant half of VWL2 data is stored in the most-significant portion of the register 502, the least-significant part of VWL2 data is sent to the code converter 504 together with the least-significant part of data in the external SRAM 503 where every three bits are converted into a binary number simultaneously (FIG. 25F). Similarly, the second half of VWL2 data stored in the first half of the register 502, together with the first part of the data in the external SRAM 503, is converted into binary numbers in the code converter 504 (FIG. 25G).

Since both access and read are progressed in parallel in this manner, under the relation of $t_R < t_s/2$, the total read time is reduced to $$t_R + 3t_S + t_{CONV}$$

Moreover, in the arrangement shown in FIG. 25 preparing the external SRAM for some bits, if new data is read and output in synchronization with preceding two-level information stored there and they are converted simultaneously, the time $t_{conv}$ is reduced into a fractional level.

Additionally, since the amount of information is doubled after code conversion, a higher throughput can be obtained by doubling the read clock, i.e. in the case that serial access is performed in 50 ns, by effecting outputting from the code converter 504 into 25 ns in the above example.

Although the examples of FIGS. 22 through 24 use an independent SRAM chip, a high-speed cache memory attached to CPU may be used.

The memory cells and the register may be divided into three or more parts instead of two parts employed in the embodiment shown above. Then, the read efficiency can be further improved by optimum control of the read start address.

Thus, the invention can realize a multi-level flash memory that can flexibly determine the multiple levels in accordance of the actual power of cells and can minimize the chip size. The invention is not limited to the embodiments shown above, but involves various alterations and modifications without departing from the spirit and scope of the invention. The invention is applicable also to NOR memory cells in lieu of NAND cells shown and described above. As explained above, according to the invention configured to flexibly use memory cells depending upon available multiple levels and a mode of use, considering that the availability of memory cells for multiple levels varies within an array or between chips, an Inexpensive multi-level flash memory minimizing the chip size can be realized.

Additionally, reading of data from a divisional part of a memory cell array to a divisional part of a register is executed in parallel with transfer of data from another divisional part of the register to an external SRAM, the read speed can be increased.

What is claimed is:

1. A nonvolatile semiconductor memory device, comprising:

a memory cell array including a plurality of nonvolatile memory cells arranged in a matrix in which memory cells in one row are connected by a common word line and memory cells in one column are connected by a common bit line;

a first register for holding first digital data introduced into said memory device;

a word line voltage generating circuit for generating a plurality of different voltages converted in response to the digital data held in said first register;

a second register for holding second data introduced into said memory device;

a word line selecting circuit for selecting said word line in response to contents held in said second register;

a word line driving circuit for driving said word line selected by said word line selecting circuit with a voltage generated by said word line voltage generating circuit;

a plurality of sense amplifier circuits for detecting and amplifying the potential of said bit line and for holding data corresponding to the potential of the bit line; and a column selecting circuit for selectively outputting the data held in said sense amplifier circuits in response to third data introduced into said memory device.

2. The nonvolatile semiconductor memory device according to claim 1, further comprising:

a memory device for holding data output from said column selecting circuit; and a control circuit for supplying said first data, second data and third data and for converting data held in said memory device bit by bit.

3. The nonvolatile semiconductor memory device according to claim 1, wherein said memory cells are NAND memory cells made by serially arranging a plurality of stacked gate MOS transistors.

4. The nonvolatile semiconductor memory device according to claim 1, wherein said sense amplifiers circuits compare a detected potential of said bit line with data to be written, and generate additional write data.

5. The nonvolatile semiconductor memory device according to claim 1, wherein said sense amplifier circuits compare a detected potential of said bit line with data to be written, then generate additional write data, and detect whether the writing is completed or not, and wherein a write complete signal is generated when it is detected that the writing is completed in all of said sense amplifier circuits.

6. The nonvolatile semiconductor memory device according to claim 1, wherein said word line voltage generating circuit includes:

a voltage generating circuit for generating a plurality of output voltages;

a voltage selecting circuit for selectively outputting one of said output voltages of said voltage generating circuit in response to the digital data held in said first register; and a source follower circuit supplied with an output from said voltage selecting circuit for outputting a voltage substantially equal to the voltage of said output.

7. A nonvolatile semiconductor memory device, comprising:

a memory cell array including a plurality of nonvolatile memory cells arranged in a matrix in which memory cells in one row are connected by a common word line and memory cells in one column are connected by a common bit line;

a first register for holding first digital data introduced into said memory device;

a word line voltage generating circuit for generating a plurality of different voltages converted in response to the digital data held in said first register;

a second register for holding second data introduced into said memory device;

a word line selecting circuit for selecting said word line in response to contents held in said second register;

a word line driving circuit for driving said word line selected by said word line selecting circuit with a voltage generated by said word line voltage generating circuit;

a plurality of sense amplifier circuits for detecting and amplifying the potential of said bit line and for holding data corresponding to the potential of the bit line;

a column selecting circuit for selectively outputting the data held in said sense amplifier circuits in response to a third data introduced into said memory device; and a plurality of flag cells each associated with a memory cell group including a plurality of memory cells in said memory cell array to hold the number of data stored in a single memory cell in the associated memory cell group.

8. The nonvolatile semiconductor memory device according to claim 7, wherein said flag cells hold nonvolatile storage.

* * * * *